United States Patent
Takahashi

(10) Patent No.: US 12,557,600 B2
(45) Date of Patent: Feb. 17, 2026

(54) SEMICONDUCTOR DEVICE MANUFACTURING DEVICE AND MANUFACTURING METHOD

(71) Applicant: Yamaha Robotics Co., Ltd., Tokyo (JP)

(72) Inventor: Makoto Takahashi, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 944 days.

(21) Appl. No.: 17/642,951

(22) PCT Filed: Apr. 16, 2021

(86) PCT No.: PCT/JP2021/015681
§ 371 (c)(1),
(2) Date: Mar. 15, 2022

(87) PCT Pub. No.: WO2021/225066
PCT Pub. Date: Nov. 11, 2021

(65) Prior Publication Data
US 2022/0336256 A1 Oct. 20, 2022

(30) Foreign Application Priority Data
May 8, 2020 (JP) .................. 2020-082427

(51) Int. Cl.
*B25J 15/06* (2006.01)
*B65G 47/91* (2006.01)
*H01L 21/683* (2006.01)

(52) U.S. Cl.
CPC ...... *H01L 21/6838* (2013.01); *B25J 15/0675* (2013.01); *B65G 47/911* (2013.01)

(58) Field of Classification Search
CPC . H01L 21/6838; B25J 15/0675; B65G 47/911
(Continued)

(56) References Cited

U.S. PATENT DOCUMENTS 6,193,132 B1 * 2/2001 Shibata .................. B23K 3/04
228/103
10,692,833 B2 6/2020 Kim et al.
(Continued)

FOREIGN PATENT DOCUMENTS

JP 3919684 5/2007
JP 2012084740 4/2012
(Continued)

OTHER PUBLICATIONS

"Office Action of Korea Counterpart Application", issued on Feb. 21, 2024, with English translation thereof, p. 1-p. 14.
(Continued)

*Primary Examiner* — Paul T Chin
(74) *Attorney, Agent, or Firm* — JCIPRNET

(57) ABSTRACT

This semiconductor device manufacturing device comprises: a stage; a bonding head; a copying mechanism provided on the bonding head; and a controller that executes the copying process to adjust a facing surface to be parallel to a reference plane by having the facing surface, which is a holding surface or a chip end face, follow the reference plane 110, which is a planar surface of the stage or a substrate. In the copying process, the controller moves the bonding head relative to the surface direction of the reference plane with the facing surface left abutting the reference plane in a state with the copying mechanism switched to a free state, until the axial direction position of the bonding head reaches a stipulated reference position, and when the axial direction position reaches the reference position, switches the copying mechanism to a locked state.

7 Claims, 7 Drawing Sheets

(58) Field of Classification Search
USPC .......................................................... 294/183
See application file for complete search history.

(56) References Cited

U.S. PATENT DOCUMENTS

| | | | | |
|---|---|---|---|---|
| 2014/0123454 | A1* | 5/2014 | Mohamed | H01L 24/75 29/401.1 |
| 2016/0126213 | A1* | 5/2016 | Celia, Jr. | B23K 37/0408 228/49.1 |
| 2022/0130709 | A1* | 4/2022 | Jung | H01L 21/68764 |
| 2022/0223450 | A1* | 7/2022 | Seyama | H01L 21/67144 |
| 2022/0319891 | A1* | 10/2022 | Eguchi | H05K 13/04 |
| 2022/0359240 | A1* | 11/2022 | Takahashi | H01L 24/75 |
| 2023/0207514 | A1* | 6/2023 | Gao | H01L 24/74 438/107 |
| 2024/0021448 | A1* | 1/2024 | Chang | H01L 24/08 |

FOREIGN PATENT DOCUMENTS

| | | |
|---|---|---|
| JP | 2015126007 | 7/2015 |
| KR | 20180040349 | 4/2018 |
| KR | 102037964 | 10/2019 |

OTHER PUBLICATIONS

"International Search Report (Form PCT/ISA/210) of PCT/JP2021/015681," mailed on Jun. 8, 2021, with English translation thereof, pp. 1-4.

"Office Action of Taiwan Counterpart Application" with English translation thereof, issued on May 9, 2022, p. 1-p. 16.

"Office Action of China Counterpart Application", with partial English translation thereof, issued on Sep. 28, 2024, pp. 1-14.

"Office Action of Singapore Counterpart Application", issued on Jul. 14, 2025, p. 1-p. 8.

* cited by examiner

SEMICONDUCTOR DEVICE MANUFACTURING DEVICE AND MANUFACTURING METHOD

CROSS-REFERENCE TO RELATED APPLICATION

This application is a 371 application of the International PCT application serial no. PCT/JP2021/015681, filed on Apr. 16, 2021, which claims the priority benefits of Japan Patent Application No. 2020-082427, filed on May 8, 2020. The entirety of each of the above-mentioned patent applications is hereby incorporated by reference herein and made a part of this specification.

TECHNICAL FIELD

The specification discloses a manufacturing device and a manufacturing method for manufacturing a semiconductor device by bonding a semiconductor chip to a substrate by using a bonding head having a copying mechanism.

RELATED ART

A technique for manufacturing a semiconductor device by driving a bonding head in a state in which a semiconductor chip is sucked and held on a tip surface (referred to as "holding surface" in the following) of a bonding head and bonding the semiconductor chip to a substrate is widely known in the conventional art. In such manufacturing technique for a semiconductor device, in order to favorably bond the semiconductor chip to a front surface of the substrate, it is required that the holding surface is parallel to a planar surface of the substrate with high accuracy.

A manufacturing device in which a copying mechanism is mounted to the bonding head in order for the holding surface to be parallel to the substrate by a simple procedure is also known. Here, the copying mechanism has a fixed member including one of a concave spherical surface and a convex spherical surface and a movable member including the other of the concave spherical surface and the convex spherical surface. The movable member is capable of swinging three-dimensionally with respect to the fixed member. The copying mechanism is switchable between a free state in which the movable member is swingable and a locked state in which the swinging of the movable member is limited.

Patent Document 1 discloses a bonding head in which such copying mechanism is mounted. In Patent Document 1, when the copying mechanism is set to the free state, a second target object held by the bonding head is brought to abut against and press a first target object held on a stage, thereby adjusting the abutting surface of the second target object to be parallel to the surface of the first target object.

CITATION LIST

Patent Literature

[Patent Literature 1] Japanese Patent Lain-Open No. 3919684

SUMMARY OF INVENTION

Technical Problem

According to the technique of Citation 1, the holding surface of the bonding head can be parallel to a certain extent to the stage by a simple procedure. However, in the case where the second target object held by the holding surface of the bonding head or the bonding head is simply pressed to the stage or the first target object held by the stage, due to the influence of friction, etc., the holding surface may not be in completely parallel. That is, in the conventional technique, it is difficult to adjust the holding surface of the bonding head to be parallel to the planar surface of the stage at high accuracy.

Therefore, the specification discloses a semiconductor device manufacturing device and manufacturing method capable of adjusting the holding surface of the bonding head to be parallel to the planar surface of the stage with high accuracy by a simple procedure.

Solution to Problem

A semiconductor device manufacturing device disclosed in the specification includes: a stage on which a substrate is mounted; a bonding head, sucking and holding a chip by using a holding surface opposite to the stage, and being relatively movable with respect to the stage in a surface direction and a normal direction of the stage; a copying mechanism, which is a copying mechanism provided in the bonding head, and provided with a fixed member comprising one of a concave spherical surface and a convex spherical surface and a movable member comprising another of the concave spherical surface and the convex spherical surface and provided to be swingable with the holding surface with respect to the fixed member; and a controller, executing a copying process adjusting a facing surface, which is an end surface of the chip held on the holding surface or the holding surface, to be parallel to a reference plane, which is a planar surface of a substrate held by the stage or a planar surface of the stage, by having the facing surface follow the reference plane. The copying mechanism is switchable between a free state in which the movable member is swingable and a locked state in which swinging of the movable member is limited, and in the copying process, the controller moves the bonding head relative to the surface direction of the reference plane while keeping the facing surface abutting against the reference plane in a state in which the copying mechanism is switched to the free state until an axial direction position of the bonding head reaches a predetermined reference position, and switches the copying mechanism to the locked state at a time when the axial direction position reaches the reference position.

In this case, in the copying process, the controller may move the bonding head at least in four directions parallel to the reference plane.

In addition, in the copying process, in a procedure of moving the bonding head along a predetermined copying route, the controller may specify the axial direction position at a time when the axial direction position is closest to the stage as the reference position.

In addition, the reference position may be determined in advance based on a configuration of the bonding head and the stage or a result of a previous copying process.

A manufacturing method of a semiconductor device disclosed in the specification is a manufacturing method which manufactures the semiconductor device by bonding a chip sucked and held by a holding surface of a bonding head having a copying mechanism to a substrate mounted on a stage. The manufacturing method includes: a copying step of adjusting a facing surface, which is an end surface of the chip held on the holding surface or the holding surface, to be parallel to a reference plane, which is a planar surface of a substrate held by the stage or a planar surface of the stage, by having the facing surface follow the reference plane. The copying mechanism is provided with a fixed member comprising one of a concave spherical surface and a convex spherical surface and a movable member comprising another of the concave spherical surface and the convex spherical surface and provided to be swingable with the holding surface with respect to the fixed member, and the copying mechanism is switchable between a free state in which the movable member is swingable and a locked state in which swinging of the movable member is limited. In the copying step, the bonding head is moved relative to the surface direction of the reference plane while keeping the facing surface abutting against the reference plane in a state in which the copying mechanism is switched to the free state until an axial direction position of the bonding head reaches a predetermined reference position, and the copying mechanism is switched to the locked state at a time when the axial direction position reaches the reference position.

Effects of Invention

According to the technique disclosed in the specification, the holding surface of the bonding head can be adjusted to be parallel to the planar surface of the stage at high accuracy by a simple procedure.

DESCRIPTION OF EMBODIMENTS

Figure 1:
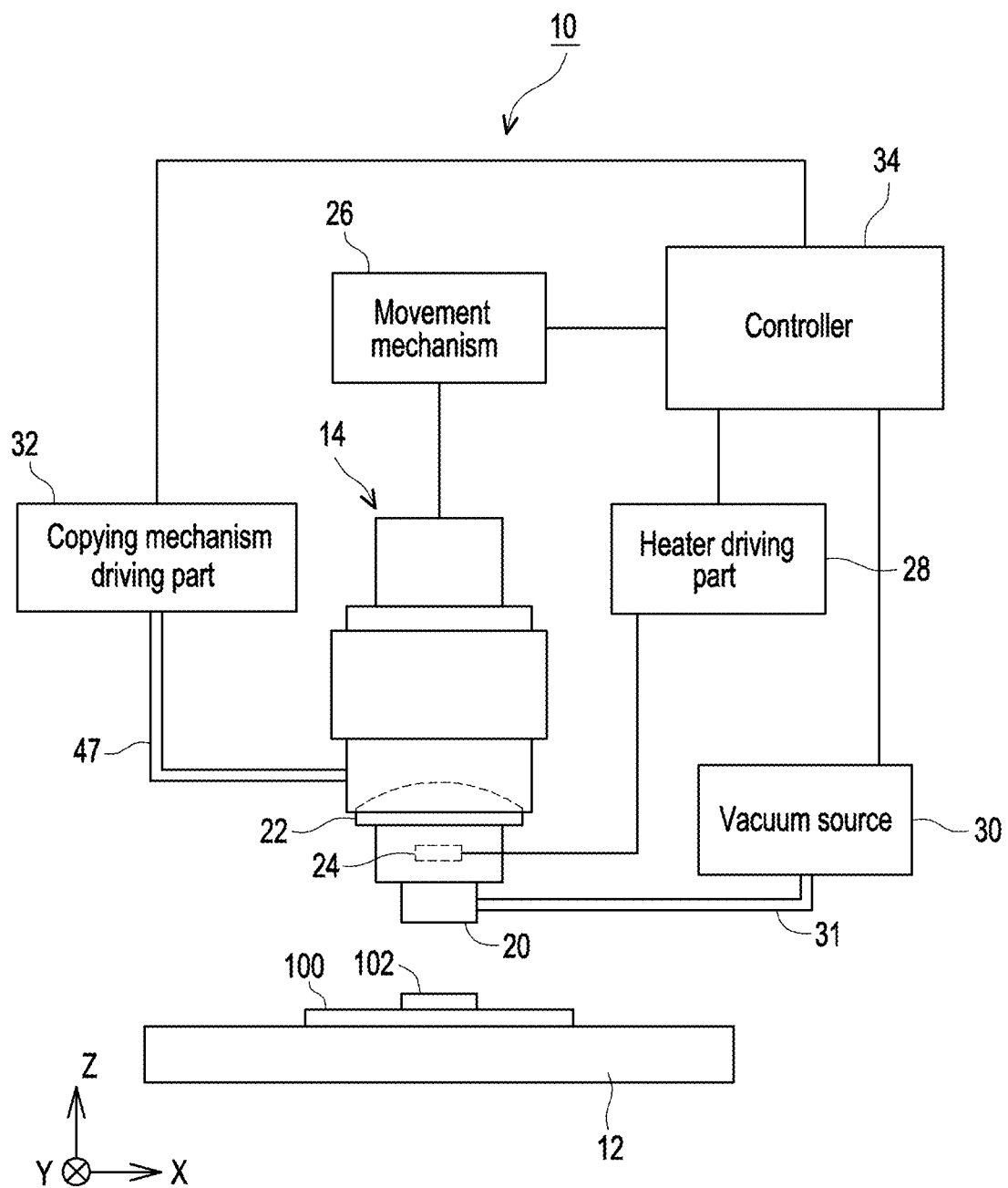
FIG. 1 is a view illustrating a configuration of a semiconductor device manufacturing device.

In the following, the configuration of a manufacturing device 10 of a semiconductor device is described with reference to the drawings. FIG. 1 is a view illustrating the configuration of the manufacturing device 10. As shown in FIG. 1, the manufacturing device 10 includes a stage 12 on which a substrate 100 is mounted, and a bonding head 14 sucking and holding a semiconductor chip 102.

The stage 12 is able to suck and hold the substrate 100. Inside the stage 12, a heater (not shown) for heating the substrate 100 is mounted. The heating and sucking of the stage 12 are controlled by a controller 34 to be described afterwards. The stage 12 of this example is a fixed stage whose positions in the vertical direction and the horizontal direction remain the same.

However, depending on the situation, the stage 12 may also be movable in at least one of the vertical direction and the horizontal direction.

The bonding head 14 is provided to be opposite to the stage 12, and is movable with respect to the stage 12 in the horizontal direction and the vertical direction. In order to move the bonding head 14, a movement mechanism 26 is provided. The movement mechanism 26, for example, includes a drive source such as a motor, a hydraulic pressure cylinder, etc., and a transmission mechanism, such as a linear motion mechanism, a gear, etc., transmitting the action of the drive source to the bonding head 14. The driving of the movement mechanism 26 is controlled by the controller 34.

The bonding head 14 sucks and holds the semiconductor chip 102 on a holding surface 20, which is a tip surface of the bonding head 14. Therefore, a suction hole (not shown) for sucking and holding the semiconductor chip 102 is formed on the tip part of the bonding head 14, and the suction hole is connected to a vacuum source 30 via an air pipe 31. In addition, a heater 24 for heating the semiconductor chip 102 being held is hidden in the tip part of the bonding head 14. The heater 24 is controlled by a heater driving part 28.

After sucking and holding the semiconductor chip 102 by using the holding surface 20, the bonding head 14 mounts the semiconductor chip 102 on the front surface of the substrate 100, and performs pressing and heating, thereby bonding the semiconductor chip 102 to the substrate 100. In recent years, the miniaturization of semiconductor processes has led to a high degree of integration of semiconductor devices. To enable such high integration, it is necessary to keep the degree of parallelism between the substrate 100 and the semiconductor chip 102 bonded to the substrate 100 with high accuracy. As a means of such parallelism adjustment, a manual angle adjustment apparatus known as a goniometer stage, a method for fine-tuning the inclination by sandwiching a shim, etc., have been proposed. However, these conventional parallelism adjustment means require high skills and a significant amount of adjustment time.

Figure 2:
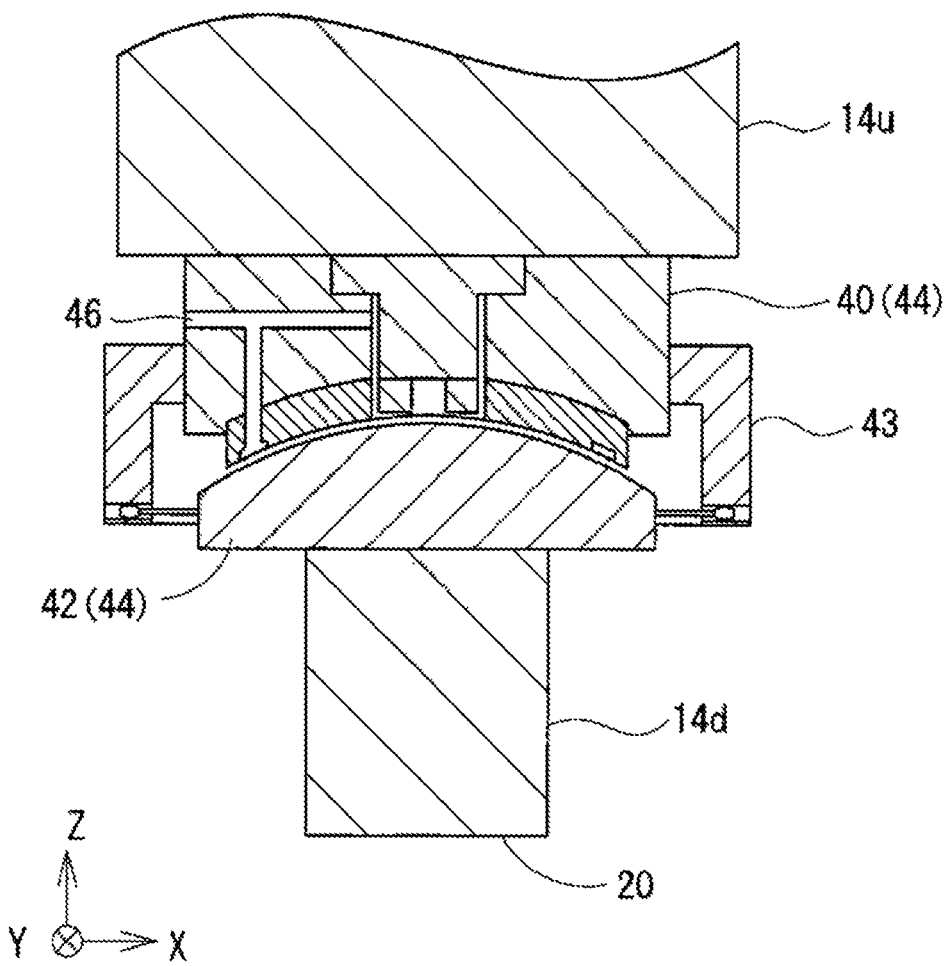
FIG. 2 is a view illustrating a configuration of a copying mechanism.

Therefore, to be able to perform parallelism adjustment by a simple procedure, a copying mechanism 22 is mounted to the bonding head 14 of the example. The copying mechanism 22 is an air pressure apparatus in which a spherical air static pressure bearing 44 (as shown in FIG. 2) is provided. In the following, in the bonding head 14, the upper side with respect to the copying mechanism 22 is referred to as "upper part 14u", and the lower side is referred to as "lower part 14d".

FIG. 2 is a view illustrating an example of the configuration of the copying mechanism 22. The copying mechanism 22 has a fixed member 40, a movable member 42 movable with respect to the fixed member 40, and a holder 43. The spherical air static pressure bearing 44 is configured by the fixed member 40 and the movable member 42. The upper end of the fixed member 40 is fixed to the upper part 14u of the bonding head 14. The bottom surface of the fixed member 40 is formed as a concave semi-spherical surface. In addition, an air passage 46 for supplying or sucking air is formed in the fixed member 40. The air passage 46 penetrates from the side surface of the fixed member 40 to the bottom surface (that is, the concave semi-spherical surface). An air pipe 47 (see FIG. 1) for fluid connection between the air passage 46 and the copying mechanism driving part 32 is connected to the side surface of the fixed member 40.

The movable member 42 is held to be three-dimensionally swingable with respect to the fixed member 40. The lower end of the movable member 42 is fixed to the lower part 14d of the bonding head 14, and the movable member 42 is swingable with the holding surface 20. In addition, the upper surface of the movable member 42 forms a convex semi-spherical surface corresponding to the concave semi-spherical surface of the fixed member 40. The holder 43 holds the movable part 42 so as not to interfere with the swinging of the movable member 42.

In the copying mechanism 22, by injecting compressed air from the concave semi-spherical surface of the fixed member 40, the movable part 42 is separated from the fixed member 40 and supported in a non-contact state. Accordingly, the sliding resistance of the movable member 42 is significantly reduced, and it is possible to rotate with high accuracy by exerting a light force. In addition, by stopping supplying the compressed air and vacuum-sucking the movable member 42, the movable member 42 can be fixed in a predetermined posture. In the following, a state in which the compressed air is injected, and the swinging of the movable member 42 is allowed is referred to as "free state", and a state in which the movable member 42 is vacuum-sucked and the swinging of the movable member 42 is limited is referred to as "locked state".

The switching of the free state and the locked state of such copying mechanism 22 is performed by the copying mechanism driving part 32. The copying mechanism driving part 32 is provided with a compressor for supplying compressed air and a vacuum source for vacuum suction. In addition, the driving of the copying mechanism driving part 32 is controlled by the controller 34.

The controller 34 controls the driving of the respective parts of the manufacturing device 10. Specifically, the controller 34 executes a mounting process which drives the movement mechanism 26 or the heater driving part 28, the vacuum source 30, etc., and bonds the semiconductor chip 102 to the substrate 100. In addition, prior to the mounting process, the controller 34 also executes a copying process which adjusts the parallelism between the end surface of the semiconductor chip 102 held on the holding surface 20 or the holding surface 20 and the planar surface of the substrate 100 held by the stage 12 or the planar surface of the stage 12 by having the end surface of the semiconductor chip 102 held on the holding surface 20 or the holding surface follow the planar surface of the substrate 100 held by the stage 12 or the planar surface of the stage 12. In addition, in the following, the end surface of the semiconductor chip 102 held on the holding surface 20 or the holding surface 20 is referred to as "facing surface 50", and the planar surface of the substrate 100 held by the stage 12 or the planar surface of the stage 12 is referred to as "reference plane 110".

Such controller 34 is a computer having a processor executing various computations and a memory storing data and programs. Prior to the mounting process of the semiconductor chip 102, the controller 34 of this example executes the copying process for making adjustment so that the holding surface 20 is parallel with respect to the planar surface of the stage 12. In the following, the copying process is described.

Figure 3:
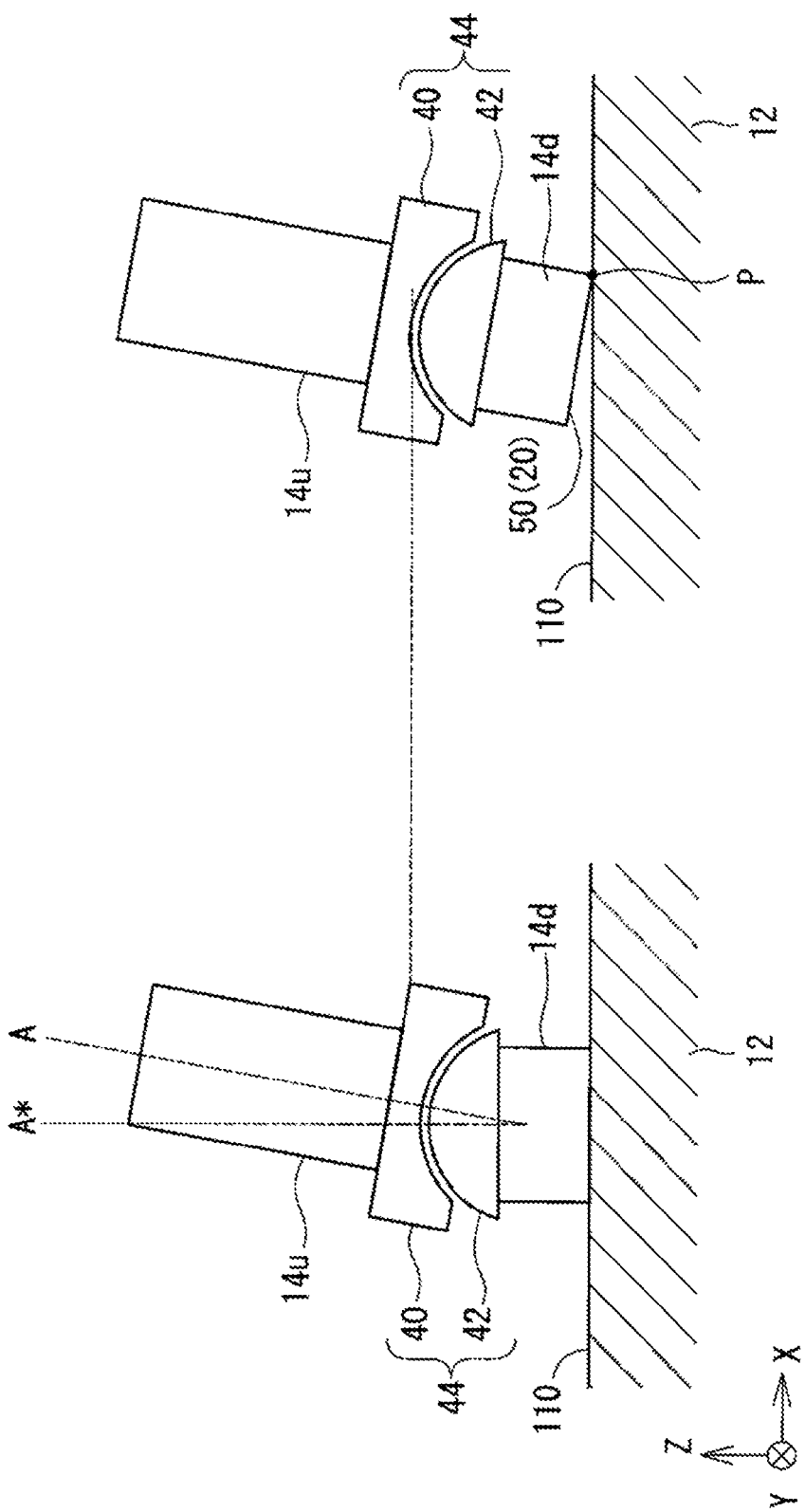
FIG. 3 is a view explaining the principle of a copying process.

FIG. 3 is a view illustrating an image explaining the principle of the copying process. In FIG. 3, the holding surface 20 is adopted as the facing surface 50, and the planar surface of the stage 12 is adopted as the reference plane 110. In general, there is a deviation in the inclination of an axis or a surface in a device. Due to the deviation, the facing surface 50 may be inclined with respect to the reference plane 110. In the example of FIG. 3, an axis A of the upper part 14u of the bonding head 14 is inclined with respect to an ideal axis A*.

In order to correct such inclination, in recent years, the use of the copying mechanism 22 is proposed. Specifically, it is proposed to adjust the parallelism of the holding surface 20 by abutting the holding surface 20 against the reference plane 110 after setting the copying mechanism 22 to the free state. In the case of the free state, the movable member 42 is swingable by a very light force. Therefore, in theory, as shown on the left of FIG. 3, the movable member 42 swings until a posture at which the entire facing surface 50 contacts the reference plane 110 and the facing surface 50 is parallel to the reference plane 110. In addition, at the time point of becoming parallel, if the copying mechanism 22 is switched to the locked state and the swinging of the movable member 42 is limited, the degree of parallelism of the facing surface 50 with respect to the reference plane 110 can be maintained with high accuracy.

However, in reality, due to slight resistance or the influence of the weight of a pipe, etc., as shown on the right of FIG. 3, the inclination of the facing surface 50 cannot be completely resolved by simply abutting the facing surface 50 against the reference plane 110, and there is still remaining parallelism offset. In the case where the copying mechanism 22 is locked in a state in which there is remaining parallelism offset, the degree of parallelism of the facing surface 50 with respect to the reference plane 110 cannot be maintained with high accuracy.

In the example, in order to more reliably reduce the remaining parallelism offset, in the state in which the copying mechanism 22 is set to the free state, the bonding head 14 is moved relative to the surface direction of the reference plane 110 while the facing surface 50 is kept abutting against the reference plane 110. Such movement easily triggers the swinging of the movable member 42, making the facing surface 50 parallel to the reference plane 110.

That is, at the time when the movable member 42 swings so as to become completely parallel as shown on the left of FIG. 3 from the state in which there is still remaining parallelism offset as shown on the right of FIG. 3, a contact point P of the facing surface 50 with the reference plane 10 slides in the outer side direction (right direction in the right part of FIG. 3). Triggered by such sliding, the bonding head 14 is moved in the horizontal direction, specifically, the outer side direction when viewed from the contact point P. Thus, the movable member 42 swings easily and, as a result, the facing surface 50 easily becomes parallel with respect to the reference plane 110.

Here, as clearly shown in FIG. 3, compared with the state in which there is remaining parallelism offset, in the case of being completely parallel, an axial direction position Pz of the bonding head 14 is close to side of the stage 12. Therefore, the axial direction position Pz of the bonding head 14 reflects the degree of parallelism of the facing surface 50.

Therefore, in the example, in the state in which the copying mechanism 22 is set to the free state, when the bonding head 14 is moved relative to the surface direction of the reference plane 110, the axial direction position Pz of the bonding head 14 is observed, and when the axial direction position Pz reaches a predetermined reference position Pzdef, the copying mechanism 22 is switched to the locked state. Here, the reference position Pzdef may be specified in the process in which the bonding head 14 is moved in the surface direction, and may also be determined in advance according to the configuration of the stage 12 and the bonding head 14. In either case, the axial direction position Pz able to determine that the entire facing surface 50 contacts the reference plane 110 is set as the reference position.

In addition, depending on the orientation of the inclination of the facing surface 50, the movement direction of the bonding head 14 able to reduce the inclination differs. For example, on the right of FIG. 3, the facing surface 50 is inclined toward the lower right. In such case, compared with moving the bonding head 14 leftward, the chance of reducing the remaining offset by moving the bonding head 14 rightward is higher. However, it is difficult to learn the orientation of the inclination of the facing surface 50 beforehand. Therefore, at the time when the bonding head 14 is moved in the surface direction, the bonding head 14 is at least moved in four directions parallel to the reference plane 110. For example, the bonding head 14 is moved in the +X direction, −X direction, +Y direction, and −Y direction. By moving the bonding head 14 in such four directions, in whichever orientation the facing surface 50 is inclined, the inclination can be more reliably resolved.

Figure 4:
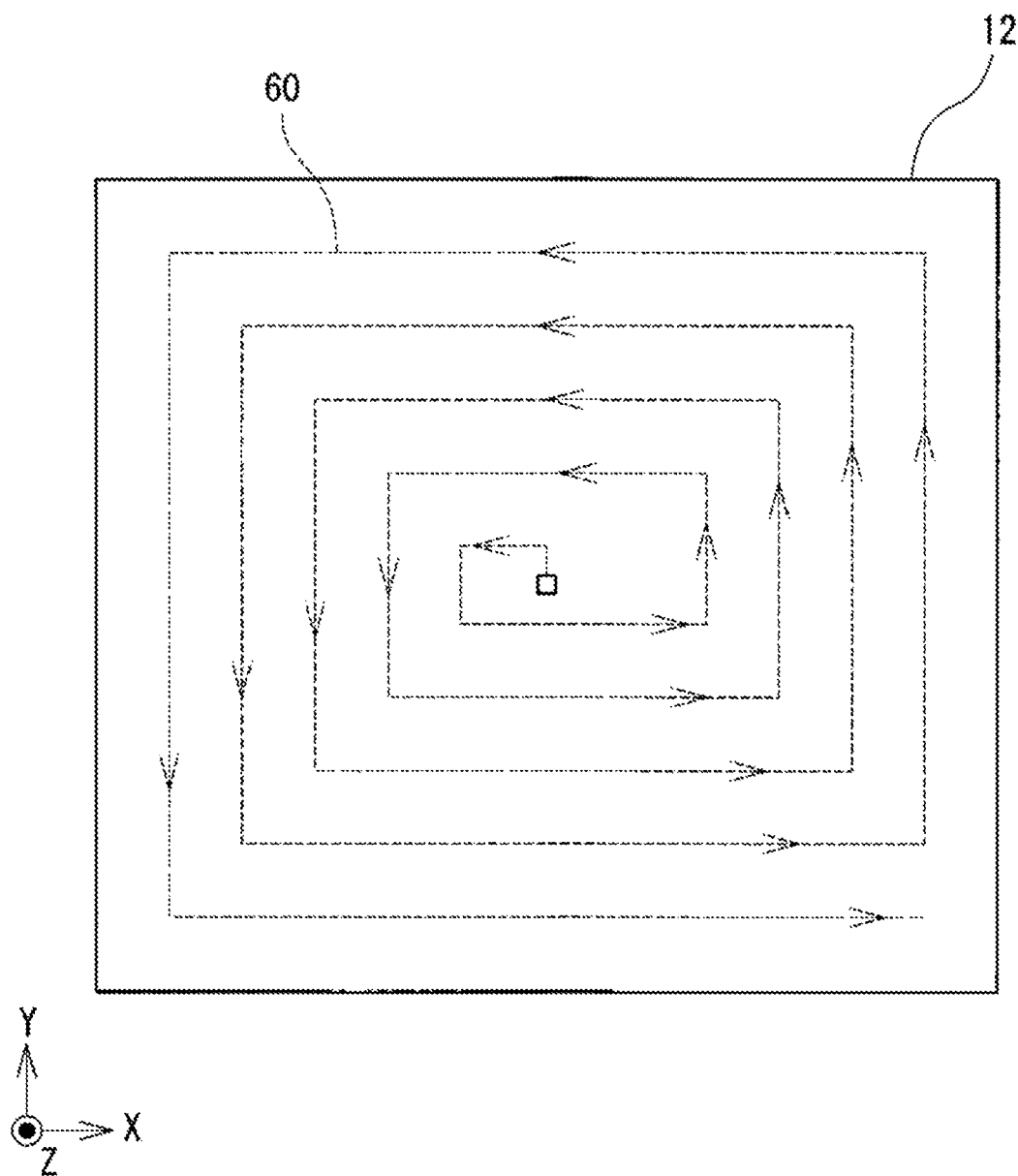
FIG. 4 is a view illustrating an example of a copying route.
Figure 5:
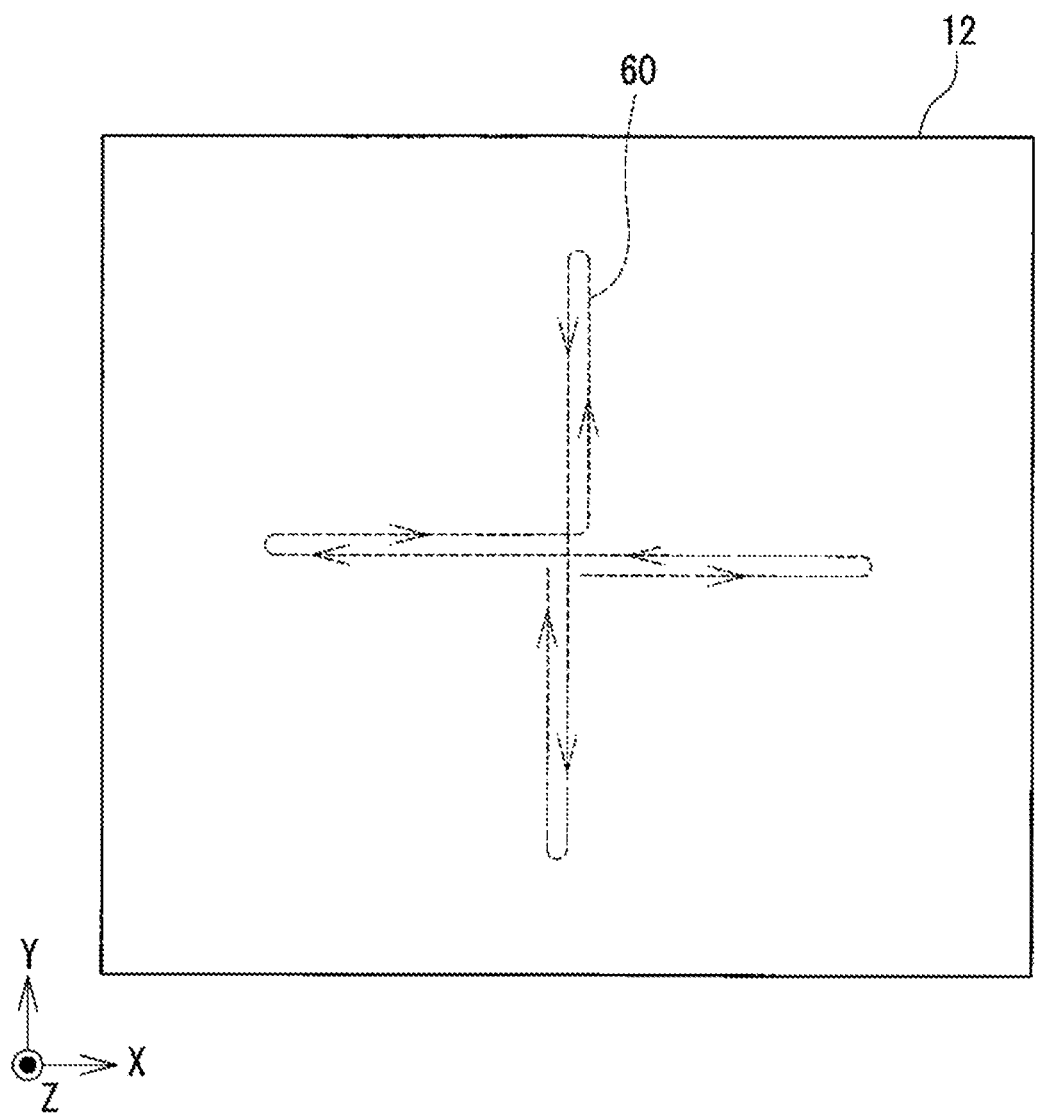
FIG. 5 is a view illustrating another example of a copying route.

FIG. 4 is a view illustrating an example of a route (referred to as "copying route 60" in the following) at the time when the bonding head 14 is moved. In the example of FIG. 4, the copying route 60 is in a rectangular spiral shape from the center of the stage 12 toward the outer side. However, the shape of the copying route 60 may be changed as appropriate, such as a one-stroke cross shape as shown in FIG. 5. In any case, such copying route 60 is stored in advance in the storage part of the controller 34.

Figure 6:
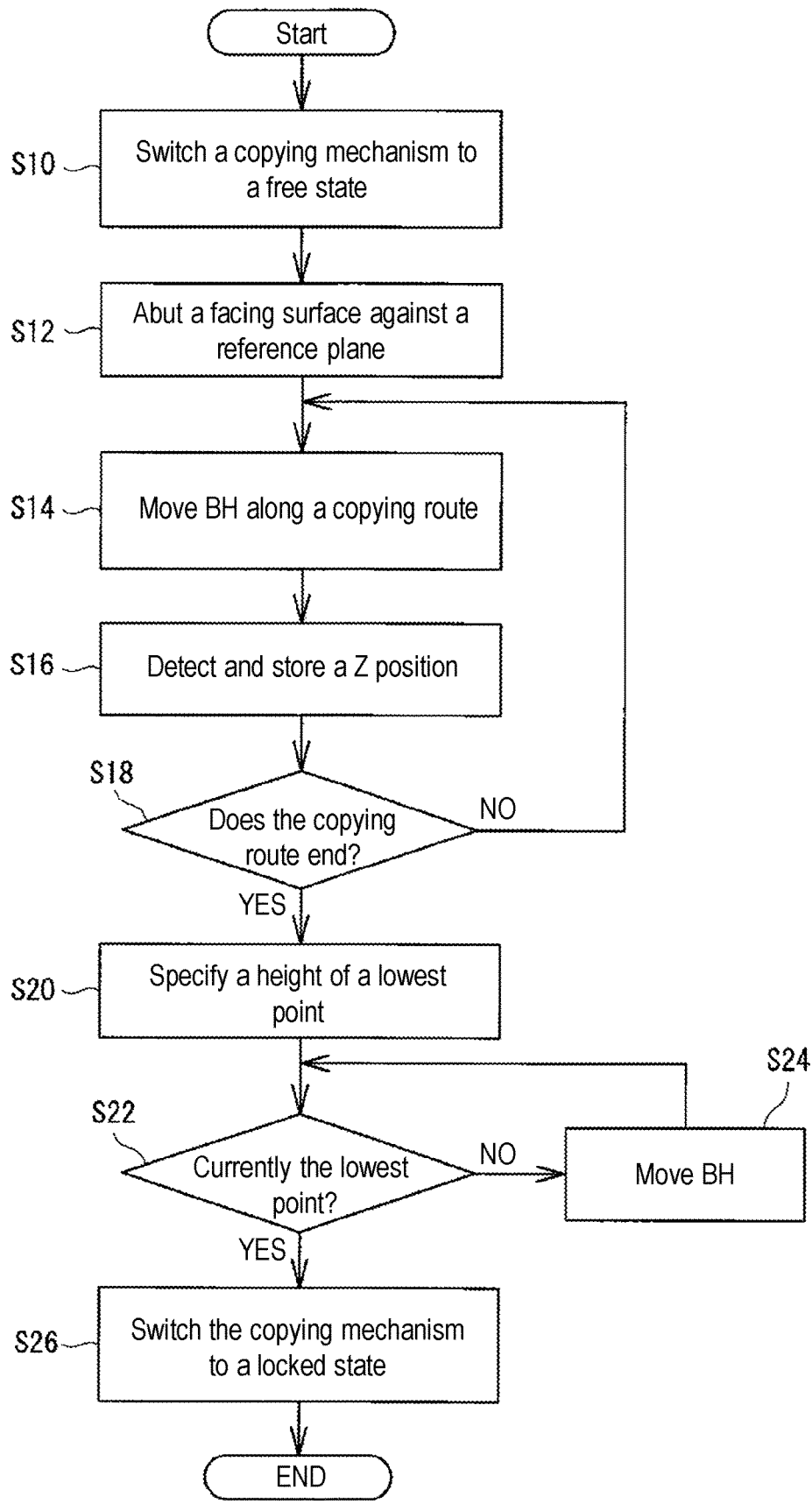
FIG. 6 is a flowchart illustrating a flow of the copying process.

Then, a flow of the copying process for adjusting the facing surface 50 to be parallel with respect to the reference plane 110 is described. FIG. 6 is a flowchart illustrating a flow of the copying process. When the copying process is executed, the bonding head 14 may hold or not hold a chip member. In the case of holding a chip member, the bottom surface of the chip member serves as the facing surface 50. In addition, in the case of not holding a chip member, the holding surface 20 of the bonding head 14 serves as the facing surface 50. Similarly, the stage 12 may hold or not hold the substrate 100. In the case of holding the substrate 100, the upper surface of the substrate 100 serves as the reference plane 110, and in the case of not holding the substrate 100, the upper surface of the stage 12 serves as the reference plane 110.

At the time of executing the copying process, the controller 34 firstly drives the copying mechanism driving part 32 and switches the copying mechanism 22 to the free state (S10). Then, the controller 34 drives the movement mechanism 26 and lowers the bonding head 14 until the facing surface 50 abuts against the reference plane 110 (S12). The presence or absence of the abutting, for example, may be determined by detecting a reaction force from the reference plane 110, and may also be determined from a change of the axial direction position Pz of the bonding head 14.

If the facing surface 50 abuts against the reference plane 110, the controller 34 drives the movement mechanism 26 to move the bonding head 14 along the copying route 60 (S14), while maintaining the copying mechanism 22 in the free state. At the time of the movement, the axial direction position Pz of the bonding head 14 is detected by the position sensor provided in the movement mechanism 26. The controller 34 periodically detects the axial direction position Pz detected by the position sensor and stores the axial direction position Pz in the storage part (S16).

If the movement along the predetermined copying route 60 ends (Yes in S18), the controller 34 specifies a lowest point height Pzmin which is the minimum (i.e., closest to the stage 12) among the axial direction positions Pz stored in the storage part, and sets the lowest point height Pzmin as the reference position Pzdef (S20). Then, the controller 34 determines whether the current axial direction position Pz of the bonding head 14 is at the reference position Pzdef (S22).

In the case where the current axial direction position Pz is at the reference position Pzdef (Yes in S22), the controller 34 determines that the remaining parallelism offset has been resolved, and drives the copying mechanism driving part 32 to switch the copying mechanism 22 to the locked state (S26). Meanwhile, in the case where the current axial direction position Pz does not appear at the reference position Pzdef (No in S22), the controller 34 drives the movement mechanism 26 and moves the bonding head 14 in a direction parallel to the reference plane 110 (S24). The movement route at this time may be the same as or different from the copying route 60. In any case, if the result of movement indicates that the current axial direction position Pz reaches the reference position Pzdef (Yes in S22), the copying mechanism 22 is switched to the locked state (S26).

As described above, in the example, after the facing surface 50 abuts against the reference plane 110, the bonding head 14 is moved in the surface direction while the free state is maintained. As a result, the remaining parallelism offset generated due to friction or the weight of the pipe, etc., can be more reliably reduced, and the degree of parallelism of the facing surface 50 with respect to the reference plane 110 can remain high. Also, in the example, based on the axial direction position Pz obtained during the process of moving the bonding head 14 in the surface direction, the reference position Pzdef is set. As a result, even if the configuration of the bonding head 14 and the stage 12 is changed from the time when the configuration is designed due to changes through time, etc., a suitable reference position Pzdef can still be set.

Figure 7:
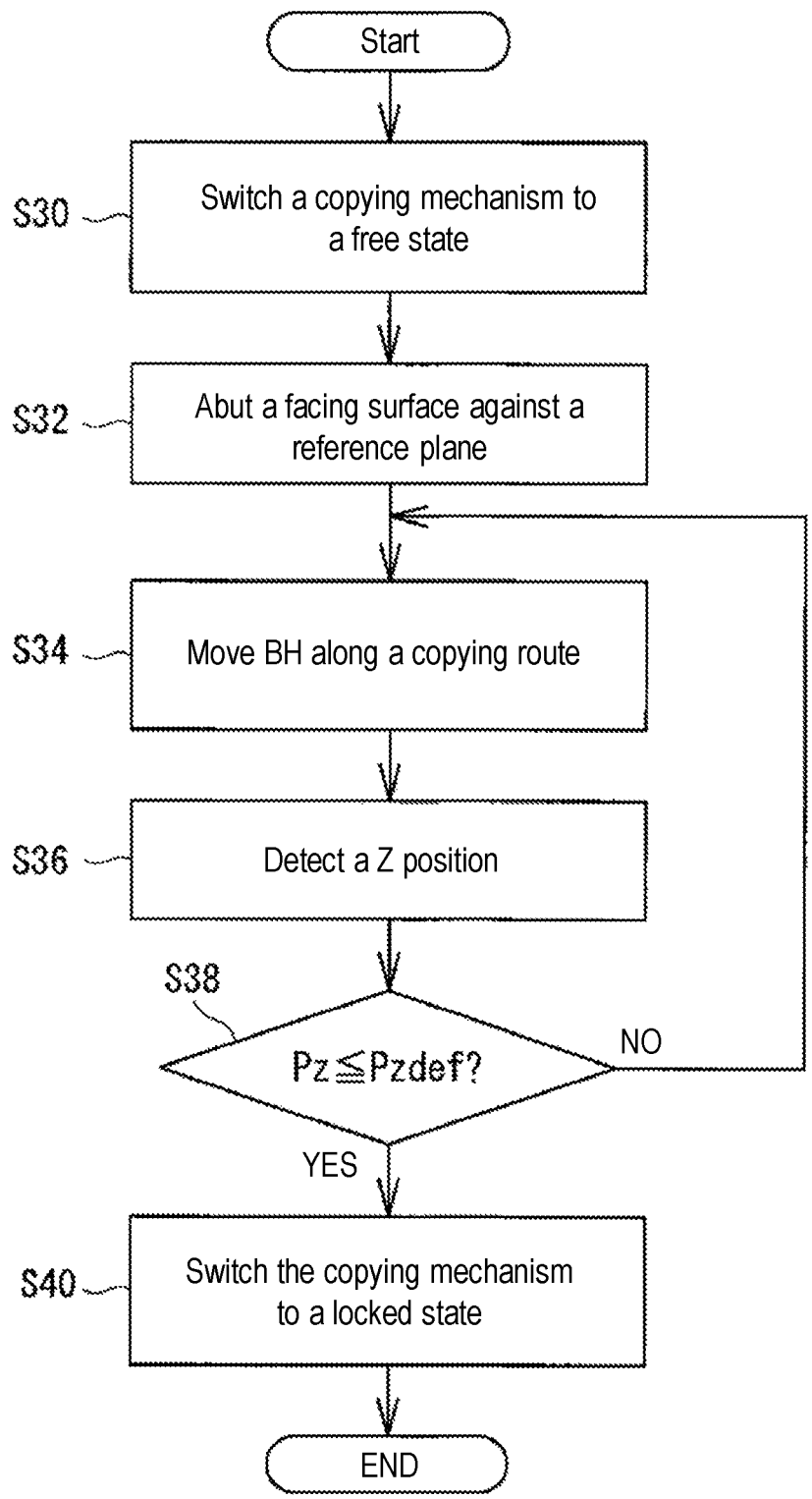
FIG. 7 is a flowchart illustrating a flow of the copying process of another example.

Then, the flow of the copying process of another example is described. FIG. 7 is a flowchart illustrating a flow of the copying process of another example. In the copying process, the controller 34 sets the reference position Pzdef in advance and stores the reference position Pzdef in the storage part. The reference position Pzdef may be determined from the configuration relationship between the stage 12 and the bonding head 14, that is, determined from the dimension values and the positions in the design of the two components. Also, in other embodiments, the reference position Pzdef may also be determined from the results of previous copying processes. For example, the lowest point height Pzmin obtained at the time of the copying process previously performed in the order of FIG. 6 may be set as the reference position Pzdef.

At the time of executing the copying process, like the example of FIG. 6, after switching the copying mechanism 22 to the free state, the controller 34 lowers the bonding head 14 until the facing surface 50 abuts against the reference plane 110 (S30). Then, the controller 34 moves the bonding head 14 in the surface direction along the predetermined copying route 60 (S34). At this time, the controller 34 periodically detects the axial direction position Pz of the bonding head 14 (S36), and compares the detected axial direction position Pz to the reference position Pzdef (S38).

As a result of the comparison, in the case where the axial direction position Pz exceeds the reference position Pzdef, the controller 34 returns to Step 34 and continues to move the bonding head 14 in the surface direction. Meanwhile, in the case where the axial direction position Pz is equal to or lower than the reference position Pzdef, the controller 34 determines that the remaining parallelism offset has been resolved, and drives the copying mechanism driving part 32 to switch the copying mechanism 22 to the locked state (S40).

As described above, in the example also, after the facing surface 50 abuts against the reference plane 110, the bonding head 14 is moved in the surface direction while the free state is being maintained. Therefore, the degree of parallelism of the facing surface 50 with respect to the reference plane 110 remains high. In addition, in the example, at the time point when the axial direction position Pz reaches the reference position Pzdef set in advance, the movement of the bonding head 14 in the surface direction stops. As a result, compared with the process of FIG. 6, the copying process can be ended earlier.

It is noted that the configuration having been described so far is merely an example. Other configurations may be modified as appropriate as long as the bonding head is moved in the surface direction in the free state, and the free state is switched to the locked state at the time when the axial direction position Pz reaches the predetermined reference position Pzdef. For instance, in the above example, the bonding head 14 is moved in the four parallel directions. However, it is not necessary to move in four directions.

For example, in the case where the orientation of the inclination of the facing surface 50 can be predicted, the bonding head 14 may also be moved only in a direction able to resolve the predicted inclination. That is, a pipe for supplying or sucking air or electric wirings are connected to the lower part 14d of the movable member 42 and the copying mechanism 22. Due to the weight of the pipe and the electric wirings, after switching to the free state, the copying mechanism 22 may be greatly inclined in one direction. Such great inclination easily becomes the reason of the remaining parallelism offset. In the case where the remaining parallelism offset is present due to the pipe and electric wirings, the orientation of the inclination of the facing surface 50 can be predicted from the positions of the pipe and the electric wirings. Therefore, it may be that the orientation of the inclination of the facing surface 50 is predicted from the positions of the pipe and the electric wirings, and the movement is carried out only in the direction of the direction in which the predicted inclination can be resolved, that is, the right direction in the case of lower right. In addition, in the case of moving in the four directions, it may also be that the orientation of the inclination of the facing surface 50 is predicted, and a movement is firstly carried out in the direction in which the predicted inclination can be resolved. With such configuration, the remaining inclination can be significantly reduced in an initial operation. Therefore, in the process of FIG. 7, the time required for the process can be reduced.

Moreover, in the above description, the fixed member 40 of the copying mechanism 22 has a concave spherical surface, and the movable member 42 has a convex spherical surface. However, the arrangement may be reversed. That is, the fixed member 40 may have a convex spherical surface and the movable member 42 has a concave spherical surface. Furthermore, in the above description, the bonding head 14 is configured to move. However, in place of or in addition to the bonding head 14, the stage 12 may also be moved. Furthermore, in the example of FIG. 3, the holding surface 20 serves as the facing surface 50. However, in the copying process, a chip member, such as a chip member specialized for parallelism adjustment, may also be held on the holding surface 20, and the end surface of such chip may be handled as the facing surface 50. Similarly, in the example of FIG. 3, the upper surface of the stage 12 serves as the reference plane 110. However, in the copying process, the substrate 100, such as a substrate 100 specialized for parallelism adjustment, may also be held on the stage 12, and the upper surface of such substrate 100 may be handled as the reference plane 110.

What is claimed is:

1. A semiconductor device manufacturing device, comprising:
   a stage on which a substrate is mounted;
   a bonding head, sucking and holding a chip by using a holding surface opposite to the stage, and being relatively movable with respect to the stage in a surface direction and a normal direction of the stage;
   a copying mechanism, provided in the bonding head, and provided with a fixed member comprising one of a concave spherical surface and a convex spherical surface and a movable member comprising another of the concave spherical surface and the convex spherical surface and provided to be swingable with the holding surface with respect to the fixed member; and
   a controller, executing a copying process adjusting a facing surface, which is an end surface of the chip held on the holding surface or the holding surface, to be parallel to a reference plane, which is a planar surface of a substrate held by the stage or a planar surface of the stage, by having the facing surface follow the reference plane,
   wherein the copying mechanism is switchable between a free state in which the movable member is swingable and a locked state in which swinging of the movable member is limited, and
   in the copying process, the controller moves the bonding head relative to the surface direction of the reference plane while keeping the facing surface abutting against the reference plane in a state in which the copying mechanism is switched to the free state until an axial direction position of the bonding head reaches a predetermined reference position, and switches the copying mechanism to the locked state at a time when the axial direction position reaches the reference position.

2. The semiconductor device manufacturing device as claimed in claim 1,
   in the copying process, the controller moves the bonding head at least in four directions parallel to the reference plane.

3. The semiconductor device manufacturing device as claimed in claim 2,
   wherein in the copying process, in a procedure of moving the bonding head along a predetermined copying route, the controller specifies the axial direction position at a time when the axial direction position is closest to the stage as the reference position.

4. The semiconductor device manufacturing device as claimed in claim 2,
   wherein the reference position is determined in advance based on a configuration of the bonding head and the stage or a result of a previous copying process.

5. The semiconductor device manufacturing device as claimed in claim 1,
   wherein in the copying process, in a procedure of moving the bonding head along a predetermined copying route, the controller specifies the axial direction position at a time when the axial direction position is closest to the stage as the reference position.

6. The semiconductor device manufacturing device as claimed in claim 1,
   wherein the reference position is determined in advance based on a configuration of the bonding head and the stage or a result of a previous copying process.

7. A semiconductor device manufacturing method, which manufactures the semiconductor device by bonding a chip sucked and held by a holding surface of a bonding head having a copying mechanism to a substrate mounted on a stage, the manufacturing method comprising:
   a copying step of adjusting a facing surface, which is an end surface of the chip held on the holding surface or the holding surface, to be parallel to a reference plane, which is a planar surface of a substrate held by the stage or a planar surface of the stage, by having the facing surface follow the reference plane,
   wherein the copying mechanism is provided with a fixed member comprising one of a concave spherical surface and a convex spherical surface and a movable member comprising another of the concave spherical surface and the convex spherical surface and provided to be swingable with the holding surface with respect to the fixed member, and the copying mechanism is switchable between a free state in which the movable member is swingable and a locked state in which swinging of the movable member is limited, and
   in the copying step, the bonding head is moved relative to a surface direction of the reference plane while the facing surface is kept abutting against the reference plane in a state in which the copying mechanism is switched to the free state until an axial direction position of the bonding head reaches a predetermined reference position, and the copying mechanism is switched to the locked state at a time when the axial direction position reaches the reference position.

\* \* \* \* \*